United States Patent [19]

Beitner

[11] 4,346,562
[45] Aug. 31, 1982

[54] THERMOELECTRIC DEVICE AND PROCESS FOR MAKING THE SAME

[75] Inventor: Shlomo Beitner, Tel Aviv, Israel

[73] Assignee: Bipol Ltd., Tel Aviv, Israel

[21] Appl. No.: 217,585

[22] Filed: Dec. 18, 1980

[51] Int. Cl.³ .......................... F25B 21/02; F25D 3/08
[52] U.S. Cl. ............................................. 62/3; 62/457
[58] Field of Search ..................................... 62/3, 457

[56] References Cited

U.S. PATENT DOCUMENTS

| | | | |
|---|---|---|---|
| 3,048,020 | 8/1962 | Jones | 62/3 |
| 3,178,896 | 4/1965 | Sandsto | 62/3 |
| 3,399,539 | 9/1968 | Herman | 62/3 |
| 3,402,561 | 9/1968 | Mahoney | 62/3 |
| 3,823,567 | 7/1974 | Corini | 62/3 |
| 4,107,935 | 8/1978 | Beitner | 62/457 |
| 4,297,850 | 11/1981 | Reed | 62/3 |

Primary Examiner—Lloyd L. King
Attorney, Agent, or Firm—Gordon W. Hueschen

[57] ABSTRACT

There is disclosed a portable refrigerator which is formed by casting an insulating wall of foamed-in-place insulating foam in a manner which provides inner and outer shell portions on the insulating wall and a depression therein which exposes a surface of the internal thermal sink and, except for a pigtail and positive and negative contact points which points project through the outer shell portion in position to be connected with the positive and negative poles, respectively, of the thermoelectric element, completely imbeds the electrical connections. A thermoelectric element is disposed in the depression in heat-exchange with the surface of the internal thermal sink exposed by the depression and the positive and negative poles of the thermoelectric element are connected with the respective positive and negative contact points. An annular gasket of resilient and compressible sealing material is disposed on the outer shell in position such that it completely surrounds the depression and the thermoelectric element therein and covers the contact points. An external thermal sink is disposed in sealing contact with the sealing gasket and the two thermal sinks are drawn toward each other until the gasket is compressed and the thermal sinks are in heat-exchange with the thermoelectric element. The thermoelectric cooling device has a rim extending around but spaced from the external thermal sink of such height that the edge of the rim and the outermost surfaces of the external thermal sink are substantially in a common plane.

19 Claims, 5 Drawing Figures

THERMOELECTRIC DEVICE AND PROCESS FOR MAKING THE SAME

FIELD OF INVENTION AND PRIOR ART

This invention relates to a thermoelectric device and a process for making the same.

The invention is particularly directed to improvements in the cooling device illustrated in U.S. Pat. No. 4,107,934.

Thermoelectric devices powered by a thermoelectric element of the Peltier type are well known in the art, as shown by the above-identified patent and the patents cited therein. The device shown in U.S. Pat. No. 4,107,934 has the advantage that the thermoelectric element is not completely imbedded in the insulating wall, but has the disadvantage that the thermoelectric element is exposed to the ambient atmosphere and is susceptible to malfunctioning in inclement weather or in marine usage. It also has the disadvantage that the external thermal sink is exposed to accidental blows which can damage the thermoelectric element. It further has the disadvantage that it is expensive and difficult to manufacture.

OBJECTS OF THE INVENTION

It is an object of the invention to provide an improved thermoelectric device and process for making the same. It is a further object of the invention to provide an improved thermoelectric cooling device. It is a further object of the invention to provide for the economic and facile manufacture of such devices. It is a still further object of the invention to provide thermoelectric devices of the class described which are insensitive to ambient conditions involving water, as in inclement weather and in marine usage. Still another object of the invention is to provide a thermoelectric device of the class described in which the external thermal sink is protected against accidental blows which might damage the thermoelectric element.

BRIEF DESCRIPTION OF THE INVENTION

This invention relates to a thermoelectric device powered by a thermoelectric element of the Peltier type which comprises an insulating wall of foamed-in-place insulating foam cast about an internal thermal sink in a manner which produces an inner and outer shell portion on the insulating wall and a depression therein which exposes a surface of the internal thermal sink, the thermoelectric element being disposed in this depression in heat-exchange with the surface of the internal thermal sink exposed by the depression; and an annular resilient and compressible sealing gasket disposed on the outer shell portion in sealing contact with outer shell portion and an external thermal sink and being compressible thereby, the sealing gasket being maintained under compression and the thermal sinks being maintained in heat-exchange with the thermoelectric element by draw means which draws the two thermal sinks toward each other sufficiently to compress the gasket and to bring them into heat-exchange with the thermoelectric element.

The inner and outer shell portions can be pre-formed or formed from polyurethane foam in which the inner and outer shell portions are formed in situ as a skin on the polyurethane foam.

This aspect of the invention also comprises a process which comprises casting the insulating wall of foamed-in-place plastic about the internal thermal sink in a manner which provides inner and outer shell portions on the insulating wall and a depression therein which exposes a surface of the internal thermal sink; placing the thermoelectric element in the depression in heat-exchange with the surface of the internal thermal sink exposed by the depression; placing an annular resilient and compressible sealing gasket on the outer shell portion in position such that it completely surrounds the depression and the thermoelectric element therein; placing an external thermal sink in sealing contact with the sealing gasket; and, drawing the two sinks toward each other until the gasket is compressed and the thermal sinks are in heat-exchange with the thermoelectric element.

In the process, the inner and outer shell portions are either pre-formed or, the insulating foam is a polyurethane foam which is cast in such a manner as to form the inner and outer shell portions in situ.

The invention also comprises electrical connectors which, except for positive and negative contact points which project through the outer shell portion in position to be connected to the positive and negative poles, respectively, of the thermoelectric element, are completely imbedded in the insulating wall and electrically-connected with the contact points and in which the contact points are covered by the annular sealing gasket and thus protected from exposure to moisture.

According to another aspect of the invention, there is provided a thermoelectric cooling device having an insulating wall with an insulated thermal sink imbedded in the insulation thereof and having a surface thereof adjacent the surface of the insulating wall and exposed by a depression therein which has a thermoelectric device having a cold face and a hot face disposed in the depression with the cold face thereof in heat-exchange with the surface of the internal thermal sink exposed by the depression; an external thermal sink; and an annular resilient and compressible sealing gasket surrounding the depression and the thermoelectric element therein in sealing contact with the insulating wall and the external thermal sink and under compression between the two.

Advantageously, too, the insulating wall has electrical connectors imbedded in the insulation thereof which extend through the outer surface thereof to the thermoelectric element and in which the annular gasket overlies the outermost portion of the exposed connectors and seals them against exposure to moisture.

A further aspect of the invention comprises a thermoelectric cooling device having an insulating wall having an internal thermal sink imbedded therein and a flat external thermal sink parallel to and spaced from the insulating wall characterized in that the insulating wall has a rim extending around but spaced from the external thermal sink of such height that the edge of the rim and the outer flat surface of the external thermal sink are substantially in a common plane.

DETAILED DESCRIPTION OF THE INVENTION

Figure 3:
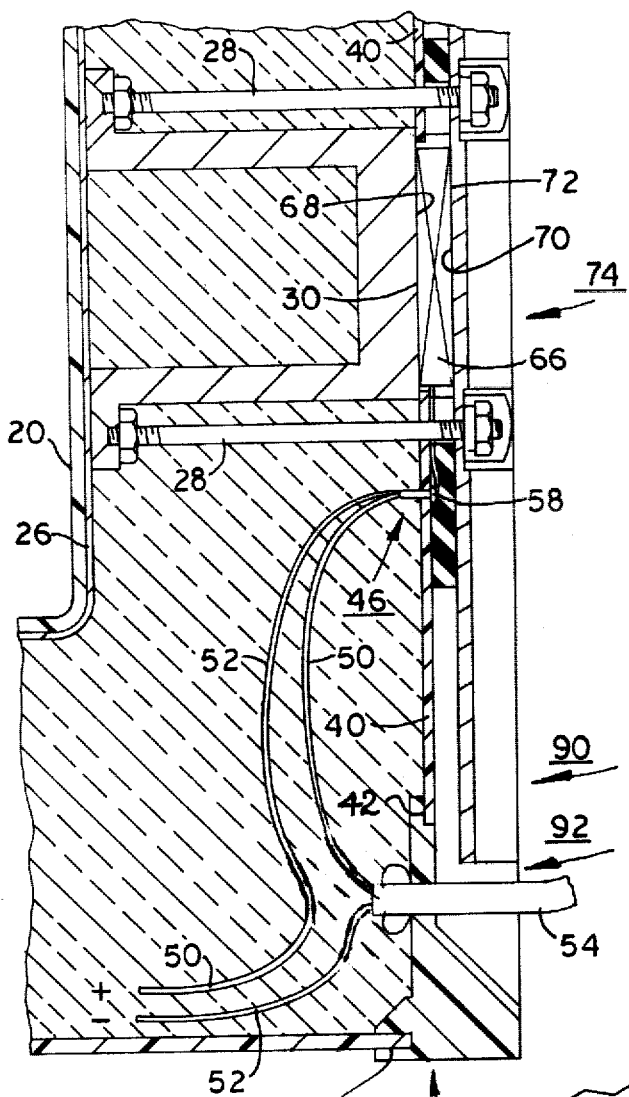
FIG. 3 is a fragmentary view of a cross-section taken along line 3—3 of FIG. 1.

In the embodiment of the invention shown in the drawings, there is provided a portable refrigerator 10, comprising a container portion 12 and a cover portion 14 fastened thereto by hasps 16 on one side, and hinges, not shown, on the other side.

Figure 2:
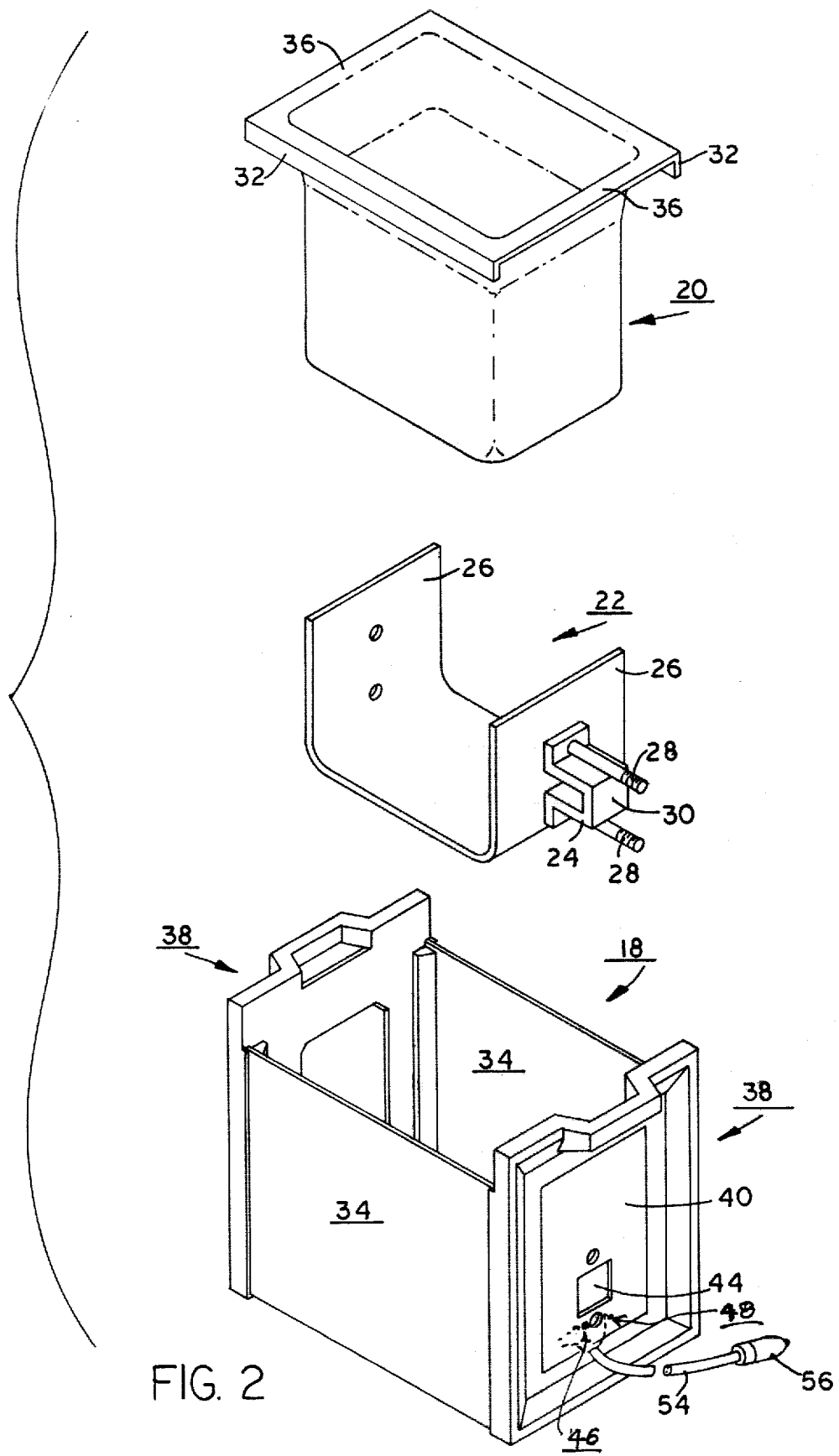
FIG. 2 is an exploded view in isometric of the box portion of FIG. 1.
Figure 4:
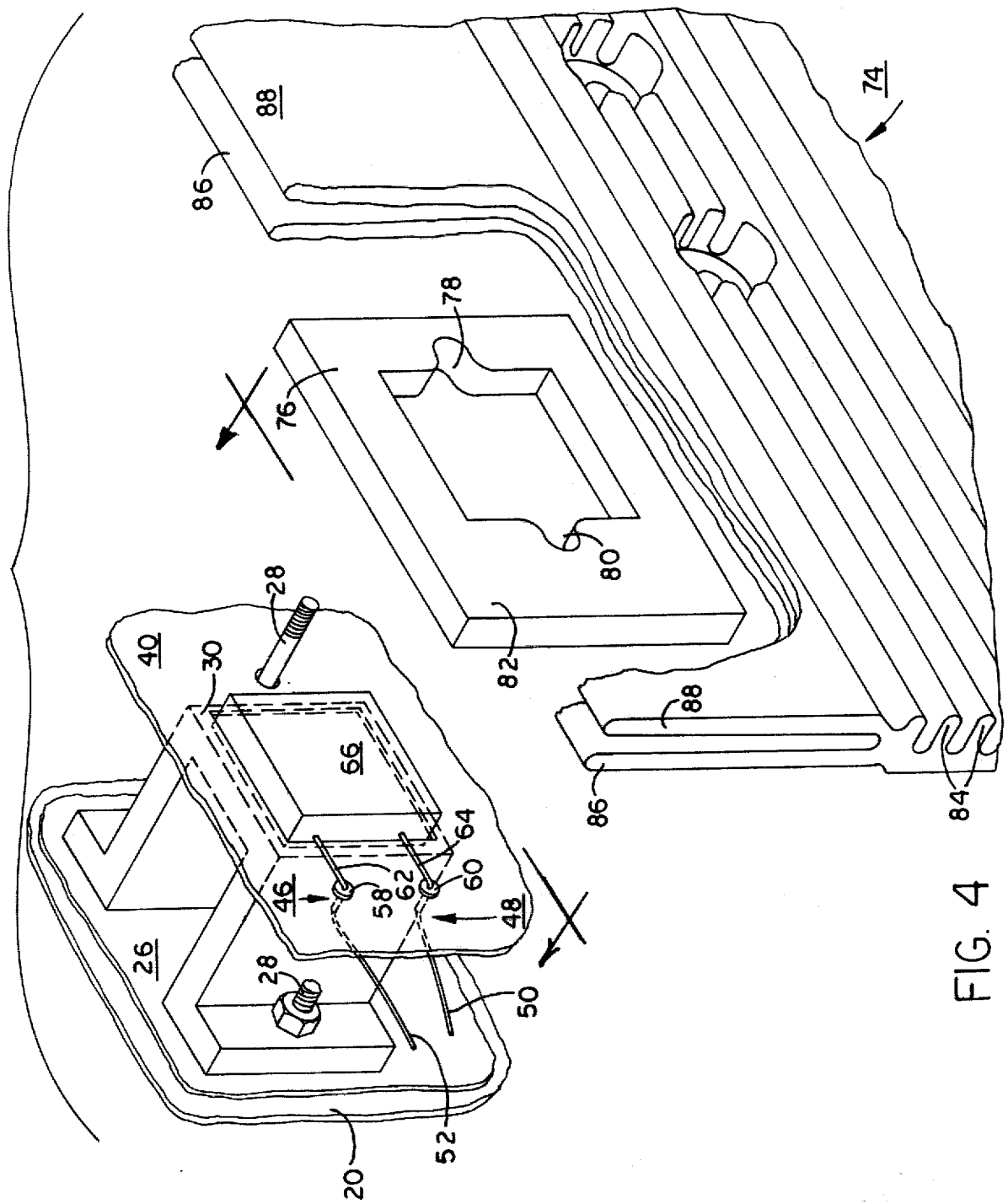
FIG. 4 is an exploded view in isometric of FIG. 3.

The container proper is made up of an outer shell 18 and an inner shell 20, as better seen FIG. 2. The inner shell 20, advantageously, is made of plastic, but could, if desired, be made of aluminum or other heat-conducting metal. Fitted snugly against the ends and bottom of the inner shell 20 is a thermal sink 22. At each end of the thermal sink 22 is a U-shaped thermal sink 24 bolted to the end walls 26 of the thermal sink 22. The bolts 28 extend out beyond the flat end or bight 30 of the U-shaped thermal sink 24, as clearly shown in FIGS. 2 and 3. When the parts are assembled, laterally-extending side rims 32 of the inner shell 20 overlap the sides 34 of the outer shell 18 and the ends 36 abut the end walls 38 of the outer shell 18 and are countersunk therein, as shown at 39, thus holding the inner shell 20 spaced from the side, ends, and bottom of the outer shell 18.

Figure 5:
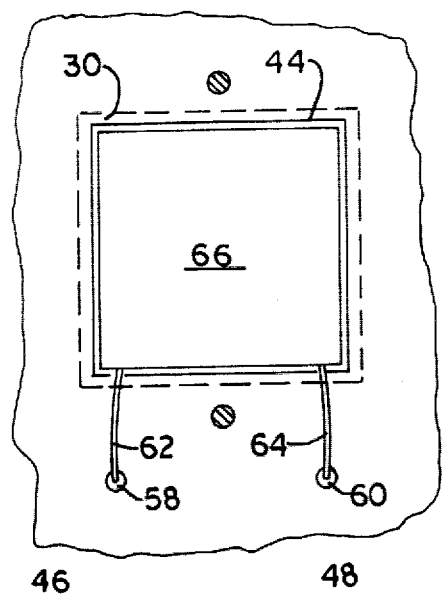
FIG. 5 is a plan view, looking in the direction of the arrows in FIG. 4.
Figure 1:
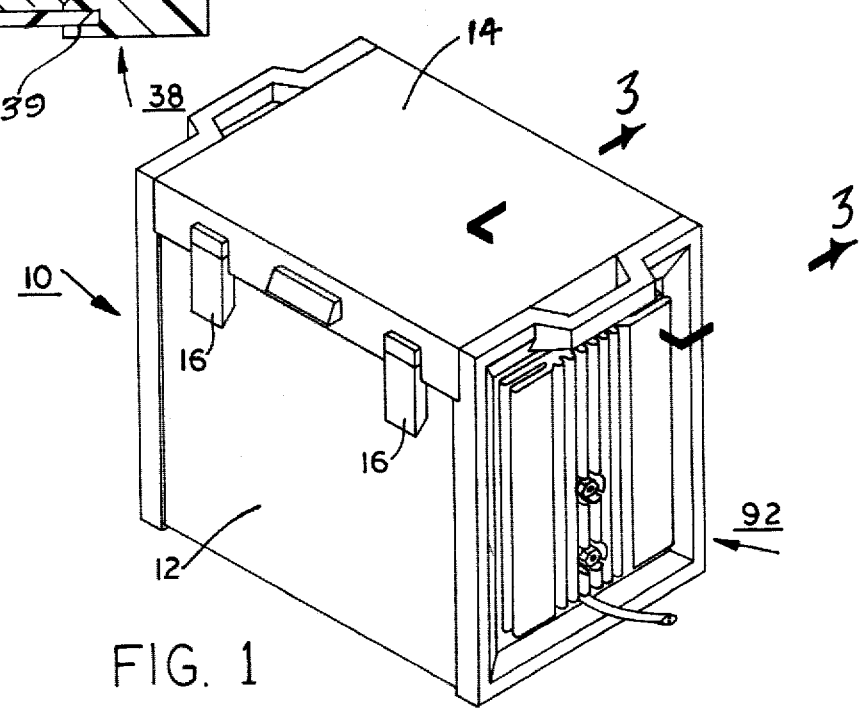
FIG. 1 is an isometric view of a portable refrigerator of the invention.

The end walls 38 have an inset panel 40 fitted in chamfers 42 in the end wall 38. The inset panel 40 has a square hole 44 which is a little smaller than the face 30 of the thermal sink 24 and oriented with respect thereto, as shown in FIG. 5. It forms a depression in the end walls 38 which expose the face 30 of the thermal sink 24.

The inset 40 has two electrical contacts 46 and 48 which are connected by electrical wires 50 and 52 to a pigtail 54, which extends out from the interior through the bottom portion of one of the walls 38 and is connected to a polarized plug 56, which is suitable for insertion into the lighter socket in a motor vehicle, such as a car, an airplane, or a boat.

When this much of the refrigerator is assembled, it is placed in a press and injected with a plastic foam-forming composition to fill the space between the inner and outer shell with foam insulation and to imbed the wires 50 and 52 and the inner portion of the electric cord 54 in the insulation.

Thereafter, the external portions 58 and 60 of the electrical connectors 46 and 48 are connected by electrical wires 62 and 64 to the positive and negative sides of the thermal electric element 66 which has a flat face 68 in surface-to-surface contact with the flat face 30 of the thermal sink 24, and a flat face 70 in surface-to-surface contact with an inner flat face 72 of an external thermal sink 74, which is bolted up tight with the thermoelectric element 66 in compression between the faces 72 and 30 by the draw bolts 28.

Before the external thermal sink 74 is put into place, there is placed around the thermoelectric element 66, an annular sealing gasket 76, composed of resilient and compressible material. This gasket is held in place by the draw bolts 28 passing up through the slots 78 and 80 in the annular gasket 76. The end 82 of the annular gasket is made long enough to overlap substantially the electrical connectors 46 and 48, as best shown in FIG. 3 and, is of such thickness that, when the external thermal sink 74 is bolted onto the thermoelectric element 66, the gasket is put in compression, thereby completely isolating the thermoelectric element from ambient conditions, such as moisture, and the like. At the same time, the overlapping portion 82 isolates the electrical connectors 46 and 48 and electrical wires 62 and 64 from exposure to ambient conditions.

The external thermal sink 74 is made of material of high heat-conductivity, for example, aluminum, has a plurality of vertically-extending ribs 84 and at least laterally-extending fins 86 and 88 extending laterally from the central panel, in which the ribs 84 are formed. The fins 88 are planar with their outer surfaces and the outer ends of the ribs 84 lying in a common plane.

The external thermal sink 74 is rectangular in shape and of a thickness so correlated with the indentations in the ends 38 of the container that the outermost surface 90 of the external thermal sink 74 is flush with the outermost surface of rim 92 of the ends 38.

The cover 14 is independently produced and filled with foam insulation and then hinged to the container 12, as already described.

Thus, there is provided a portable refrigerator container which is simple and effective in construction, symmetrical in outline, contains no external thermal sinks which project beyond the walls thereof, and in which the thermoelectric elements and the electrical connections are completely isolated from ambient conditions.

There is also provided a new and improved process in which the insulating wall is cast of foamed-in-place insulating foam about the internal thermal sink in a manner which provides inner and outer shell portions on the insulating wall and in which the parts are assembled in a manner to provide a portable refrigerator in which the thermoelectric element and the electrical connections thereto are isolated from and protected from ambient conditions.

While the specific embodiment discloses a preformed container with inner and outer shell portions, it is to be understood that the inner and outer shell portions can be formed in situ by using a polyurethane foam of the kind which, when cast in a suitable mold, produces a dense skin.

It is to be understood that the invention is not to be limited to the exact details of operation or structure shown and described, as obvious modifications and equivalents will be apparent to one skilled in the art.

I claim:

1. In a process for making a thermoelectric device powered by a thermoelectric element of the Peltier type which is held in heat-exchange between an internal thermal sink imbedded in an insulating wall and has an external thermal sink spaced from said insulating wall, and in which electrical connections connect the positive and negative poles of said thermoelectric device with an external power source, the improvement which comprises:

casting said insulating wall of foamed-in-place insulating foam about said inner thermal sink in a manner which provides an outer shell portion on said insulating wall and a depression therein which exposes a surface of said internal thermal sink;

placing said thermoelectric element in said depression in heat-exchange with the surface of the internal thermal sink exposed by said depression;

placing an annular resilient and compressible sealing gasket on said outer shell portion in position such that it completely surrounds said depression and the thermoelectric element therein;

placing said external thermal sink in sealing contact with said sealing gasket; and, drawing the two sinks toward each other until said gasket is compressed and said thermal sinks are in heat-exchange with said thermoelectric element.

2. A process of claim 1, in which the outer shell portion is pre-formed.

3. A process of claim 1, in which the insulating foam is a polyurethane foam and in which the outer shell portion is formed in situ as a skin on the polyurethane foam.

4. In a process for making a thermoelectric device powered by a thermoelectric element of the Peltier type which is held in heat-exchange between an internal thermal sink imbedded in an insulating wall and has an external thermal sink spaced from said insulating wall, and in which electrical connections connect the positive and negative poles of said thermoelectric device with an external power source, the improvement which comprises:

casting said insulating wall of foamed-in-place insulating foam about said inner thermal sink in a manner which provides outer shell portion on said insulating wall and a depression therein which exposes a surface of said internal thermal sink and, except for a pigtail and positive and negative contact points which points project through said outer shell portion in position to be connected with the positive and negative poles, respectively, of said thermoelectric element, completely imbeds said electrical connections;

placing said thermoelectric element in said depression in heat-exchange with the surface of the internal thermal sink exposed by said depression;

connecting the positive and negative poles of said thermoelectric element with the respective positive and negative contact points;

placing an annular resilient and compressible sealing gasket on said outer shell portion in position such that it completely surrounds said depression and the thermoelectric element therein and covers said contact points;

placing said external thermal sink in sealing contact with said sealing gasket; and, drawing the two sinks toward each other until said gasket is compressed and said thermal sinks are in heat-exchange with said thermoelectric element.

5. A process of claim 4, in which the outer shell portion is pre-formed.

6. A process of claim 4, in which the insulating foam is a polyurethane foam and in which the outer shell portion is formed in situ as a skin on the polyurethane foam.

7. A thermoelectric device powered by a thermoelectric element of the Peltier type comprising an insulating wall of foamed-in-place insulating foam cast about an inner thermal sink in a manner which produces an outer shell portion on said insulating wall and a depression therein which exposes a surface of said internal thermal sink, said thermoelectric element being disposed in said depression in heat-exchange with the surface of said internal thermal sink exposed by said depression; and an annular resilient and compressible sealing gasket disposed on said outer shell portion in sealing contact with said outer shell portion and an external thermal sink and being compressible thereby, said sealing gasket being maintained under compression and said thermal sinks being maintained in heat-exchange with said thermoelectric element by draw means which draws the two thermal sinks toward each other sufficiently to compress the gasket and to bring them into heat-exchange with the thermoelectric element.

8. A thermoelectric device according to claim 7, in which the outer shell portion is pre-formed.

9. A thermoelectric device according to claim 7, in which the insulating foam is a polyurethane foam and in which the outer shell portion is formed in situ as a skin on the polyurethane foam.

10. A thermoelectric device powered by a thermoelectric element of the Peltier type comprising electrical connectors, an insulating wall of foamed-in-place insulating foam cast about said inner thermal sink in a manner which produces an outer shell portion on said insulating wall and a depression therein which exposes a surface of said internal thermal sink and electrical connectors which, except for a pigtail and positive and negative contact points which points project through said outer shell portion in position to be connected with the positive and negative poles, respectively, of said thermoelectric element, completely imbeds said electrical connections; said thermoelectric element being disposed in said depression in heat-exchange with the surface of said internal sink exposed by said depression; said positive and negative poles of said thermoelectric element being connected, respectively, with the positive and negative contact points; and an annular resilient and compressible sealing gasket on said outer shell portion in position such that it completely surrounds said depression and the thermoelectric element therein and covers said contact points and is disposed on said outer shell portion in sealing contact with said outer shell portion and an external thermal sink and being compressed thereby, said sealing gasket being maintained under compression and said thermal sinks being maintained in heat-exchange with said thermoelectric element by draw means which draws the two thermal sinks toward each other sufficiently to compress the gasket and to bring them into heat-exchange with the thermoelectric element.

11. A thermoelectric device according to claim 10, in which the outer shell portion is pre-formed.

12. A thermoelectric device according to claim 10, in which the insulating foam is a polyurethane foam and in which the outer shell portion is formed in situ as a skin on the polyurethane foam.

13. A thermoelectric cooling device comprising: an insulating wall;

an internal thermal sink imbedded in the insulation of said insulating wall and having a surface thereof adjacent the surface of said insulating wall and exposed by a depression therein; a thermoelectric device having a cold face and a hot face and being disposed in said depression with the cold face thereof in heat-exchange with the surface of said internal thermal sink exposed by said depression;

an external thermal sink;

an annular resilient and compressible sealing gasket surrounding said depression and the thermoelectric element therein in sealing contact with said insulating wall and said external thermal sink; and means for drawing the two thermal sinks into contact with the faces of said thermoelectric device and at the same time to place said gasket under compression between said external thermal sink and said insulating wall.

14. In a thermoelectric cooling device comprising: an insulating wall; an internal thermal sink; a thermoelectric element; and an external thermal sink, the combination in which said external thermal sink has a surface opposed to and parallel to a surface of said insulating wall, and separated therefrom by an annular sealing gasket disposed between said surfaces and in compression between them and in which said insulating wall has electrical connectors imbedded in the insulation thereof which extend through the outer surface thereof to said thermoelectric element and in which said annular gasket overlies the outermost portion of the exposed connectors and seals them against exposure to moisture, said internal thermal sink, said insulating wall, said external thermal sink, and said annular gasket forming a water-tight compartment housing said thermoelectric element.

15. A thermoelectric cooling device having an insulating wall having an internal thermal sink imbedded therein and an external thermal sink, the outermost portions of which lie in a common plane parallel to and spaced from said insulating wall, characterized in that said device is completely static in its operation, in that said insulating wall has a vertical face, in that said external thermal sink has a face parallel to and opposed to said vertical face, in that said device has a rim extending around but spaced from said external thermal sink, in that said rim extends outwardly from said insulating wall a distance such that the edge of said rim extends outwardly at least substantially to said common plane, thereby protecting said external thermal sink while permitting free access of ambient air thereto, the parallel and opposed faces of said insulating wall and said external thermal sink being an open-ended, vertical passage up which ambient air is induced to flow by a chimney effect.

16. A thermoelectric cooling device according to claim 15, in which said external thermal sink comprises a plurality of flat fins having vertically-disposed, parallel surfaces forming open-ended vertical channels, up which ambient air is induced to flow by a chimney effect.

17. A thermoelectric cooling device having an insulating wall having an internal thermal sink imbedded therein and an external thermal sink, in which said external thermal sink comprises a plurality of flat, elongate members having inner flat surfaces which lie in a common plane parallel to and spaced from said insulating wall and form therewith vertically-disposed, elongate channels having open ends at the top and bottom thereof, further characterized in that said device is completely static in operation and in that said insulating wall has outwardly-extending rim members which are spaced from the sides of said external thermal sink and form a compartment housing the same, said rim members being spaced from said open ends to afford free access of ambient air thereto, whereby a chimney effect is induced in said channels.

18. A thermoelectric cooling device according to claim 17, in which each said flat, elongate member has a vertically-disposed channel therein which has flat, spaced-apart surfaces parallel to each other and parallel to said common plane and open ends at the top and bottom thereof, said rim members being spaced from the open ends of the second-named channels to afford free access of ambient air thereto, whereby a chimney effect is induced in said last-named channels also, thus further reducing the need for a forced draft, said flat, elongate members, lying in between said insulating wall and the outermost edges of said rim members.

19. A thermoelectric cooling device of claim 14, in which said electrical connectors which are imbedded in said insulating wall are connected to contact points in the surface of said insulating wall and in which the electrical connectors of said thermoelectric element are connected to said contact points, said annular gasket overlying said contact points and protecting them and the electric connectors of the thermoelectric element from exposure to moisture.

* * * * *